United States Patent [19]

Pastore et al.

[11] Patent Number: 5,285,352
[45] Date of Patent: Feb. 8, 1994

[54] PAD ARRAY SEMICONDUCTOR DEVICE WITH THERMAL CONDUCTOR AND PROCESS FOR MAKING THE SAME

[75] Inventors: John R. Pastore, Leander; Victor K. Nomi, Round Rock; Howard P. Wilson, Austin, all of Tex.

[73] Assignee: Motorola, Inc., Schaumburg, Ill.

[21] Appl. No.: 913,312

[22] Filed: Jul. 15, 1992

[51] Int. Cl.⁵ .............................................. H05K 7/20
[52] U.S. Cl. ................................ 361/707; 165/80.3; 165/185; 174/16.3; 257/712
[58] Field of Search .......... 357/81; 361/383, 386–389, 361/400–401; 176/16.3; 165/80.3, 185

[56] References Cited

U.S. PATENT DOCUMENTS

| | | | |
|---|---|---|---|
| 4,628,407 | 12/1986 | August et al. | 361/386 |
| 4,630,172 | 12/1986 | Stenerson et al. | 361/386 |
| 4,729,061 | 3/1988 | Brown | 361/386 |
| 4,737,395 | 4/1988 | Mabuchi et al. | 428/138 |
| 4,739,448 | 4/1988 | Rowe et al. | 361/386 |
| 4,868,349 | 9/1989 | Chia | 174/52.4 |
| 4,890,152 | 12/1989 | Hirata et al. | 357/72 |
| 4,941,067 | 7/1990 | Craft | 361/388 |
| 4,945,451 | 7/1990 | Gohl et al. | 361/388 |
| 5,093,282 | 3/1992 | Ohno et al. | 437/221 |

FOREIGN PATENT DOCUMENTS

| | | | |
|---|---|---|---|
| 0111766 | 9/1979 | Japan | 357/81 |
| 0053446 | 4/1980 | Japan | 357/81 |
| 63-307768 | 12/1988 | Japan | 361/386 |

OTHER PUBLICATIONS

Balderer et al "Heat Dissipation From IC Chips Through Module Package", IBM Tech. Dis. Bulletin, vol. 19, No. 11, Apr. 1977, pp. 4165-4166.

Cherniack et al "Microcircuit Heat Sink", IBM Technical Disclosure Bulletin, vol. 8, No. 10, Mar. 1966, p. 1457.

*Primary Examiner*—Gregory D. Thompson
*Attorney, Agent, or Firm*—Patricia S. Goddard

[57] ABSTRACT

A pad array semiconductor device (35) includes a thermal conductor (28) integrated into a circuitized substrate (14). A semiconductor die (12) is mounted on the substrate overlying the thermal conductor to establish a thermal path away from the die. The thermal conductor may also be covered or surrounded by a metallized area (37, 39), which together may serve as a ground plane in the device. Preferably one or more terminals (26) are attached to the thermal conductor for improved thermal and electrical performance. One method of integrating the thermal conductor in the substrate is to position a metal plug into an opening 30 of the substrate. The plug is then compressed or otherwise plastically deformed to fill the opening and create a substantially planar substrate surface.

32 Claims, 3 Drawing Sheets

PAD ARRAY SEMICONDUCTOR DEVICE WITH THERMAL CONDUCTOR AND PROCESS FOR MAKING THE SAME

CROSS-REFERENCE TO RELATED APPLICATION

The present invention is related to a co-pending, commonly assigned patent application entitled, "PAD ARRAY SEMICONDUCTOR DEVICE HAVING A HEAT SINK WITH DIE RECEIVING CAVITY AND METHOD FOR MAKING THE SAME," by Leo M. Higgins III, Ser. No. 07/913,319, filed concurrently Jul. 15, 1992 herewith.

FIELD OF THE INVENTION

The present invention relates to semiconductor devices in general, and more specifically to pad array semiconductor devices with thermal enhancements and processes for making such devices.

BACKGROUND OF THE INVENTION

As power and performance of semiconductor devices increase, so does the need for effective heat dissipation. Various methods of providing heat dissipation in semiconductor devices are known. One such method is to attach a heat sink external to a package body. Another known method is to incorporate a heat sink internal to a molded package body. Yet another practiced method of removing heat is to draw heat from leads of a device to a cooled substrate. Also, forcing cooled air or liquid over a device has been used for heat dissipation. These and other widely accepted methods for removing heat generally have at least two common objectives. One objective is to remove heat from as large a surface area as possible. If using a heat sink, this often involves forming contours, grooves, fins, or other features into the heat sink which increase surface area. The second objective is to position the heat removal medium, whether it be a heat sink, air, or a cooled liquid, as close to the source of heat as possible, or in other words to establish a path of least thermal resistance. In semiconductor devices, a semiconductor die and more particularly an active surface of the die is the largest source of heat generation.

A problem with many of the existing methods for removing heat in semiconductor devices is that the methods cannot be used effectively in thin or low-profile packages. An example of a low-profile package in which traditional heat removal methods are not effective is an over-molded pad array carrier (OMPAC) device. Existing OMPAC devices typically include a thin printed circuit board (PCB) substrate on which a semiconductor die is mounted. The die is electrically coupled to conductive traces formed on a top surface of the PCB. Each conductive trace is routed to a corresponding conductive trace on the bottom surface of the PCB by a conductive via which extends through the PCB. The traces on the bottom surface of the PCB each terminate at a conductive pad to form an array of pads on the bottom of the PCB (thus the term "pad array" device). The semiconductor die and the top of the PCB are encapsulated by a thin molding compound to form a package body. A solder ball is attached to each pad on the bottom of the PCB to provide external electrical accessibility to the encapsulated die.

In achieving the two objectives discussed above using traditional heat removal methods, many desirable attributes of OMPAC devices are compromised. For instance, adding a heat sink to the top of a package body to achieve a large exposed heat sink surface area in an OMPAC device undesirably increases the height or thickness of the device. To minimize a height increase, a heat sink may be positioned within a recess in the package body; however, this increases the chance of electrically short-circuiting the heat sink to wire bonds in the device. As another example, mounting a semiconductor die directly to a heat sink using conventional methods prohibits routing conductive traces underneath the die, an attractive feature which enables OMPAC devices to occupy minimal board area on a user's board.

One proposed method of avoiding the problems presented above in removing heat from OMPAC devices is to use "dummy" conductive vias to remove heat. The "dummy" conductive vias, also known as thermal vias, are typically plated vias which are not used to transmit electrical signals but which instead transmit heat away from an OMPAC device to a surrounding ambient. In most instances, thermal vias are positioned directly beneath a semiconductor die. Using such thermal vias has several disadvantages, the primary disadvantage being the limited area for removing heat. Typically, each plated via has a cross-sectional area of conductive material on the order of only 0.02 mm$^2$. Therefore, in order to effectively remove heat in a semiconductor device, a large number of thermal vias is required. Since thermal vias occupy space which would otherwise be used as signal vias, semiconductor manufacturers are reluctant to use a large number of thermal vias so that overall device size is not unnecessarily increased. Another disadvantage in using thermal vias is the potential for reliability problems. Since the conductive vias are hollow, a path for moisture and contamination exists directly beneath the die. Typically, the only impediment to contamination through thermal vias is a thin solder resist mask. However, solder resist mask materials are known to absorb moisture.

SUMMARY OF THE INVENTION

The limitations of the prior art described above are overcome and other advantages are achieved with the present invention. In one form of the invention, a semiconductor device has a circuitized substrate. The substrate has a plurality of conductive traces formed on a top surface thereof and a plurality of conductive vias extending therethrough. The conductive vias are electrically coupled to the conductive traces. The substrate also includes a die receiving area and an opening. The opening extends from the die receiving area to a bottom surface of the substrate. The opening has an area which is smaller than the die receiving area. A thermal conductor fills the opening and is substantially planar with the die receiving area and the bottom surface of the substrate. A semiconductor die is mounted to the substrate within the die receiving area and overlying the opening and the thermal conductor. The die is electrically coupled to the plurality of conductive vias, and therefore to the plurality of conductive traces, of the substrate. A plurality of terminals is attached to the bottom surface of the substrate and is electrically coupled to the plurality of conductive traces in order to provide external electrical accessibility to the semiconductor die. Other aspects of the present invention involve methods for making this device.

These and other features, and advantages, will be more clearly understood from the following detailed description taken in conjunction with the accompanying drawings. It is important to point out that the illustrations may not necessarily be drawn to scale, and that there may be other variations of the present invention which are not specifically illustrated.

DETAILED DESCRIPTION OF A PREFERRED EMBODIMENT

The present invention enables a semiconductor manufacturer to fabricate semiconductor devices, particularly pad array devices, which have effective heat removal without increasing device size and without significantly restricting pad layout. In one form of the invention, a thermal conductor, preferably in the form of a solid copper disk, is compressed into a centralized opening of a circuitized substrate such that the substrate remains planar. A semiconductor die is mounted to the substrate over the thermal conductor. The area of the thermal conductor is smaller than the area of the die such that signal routing and terminals can still exist beneath the die. If desired, the die can also be electrically coupled to the thermal conductor using a plated, metallized area which surrounds and covers the thermal conductor. The metallized area may serve as a ground plane for the device.

Figure 1:
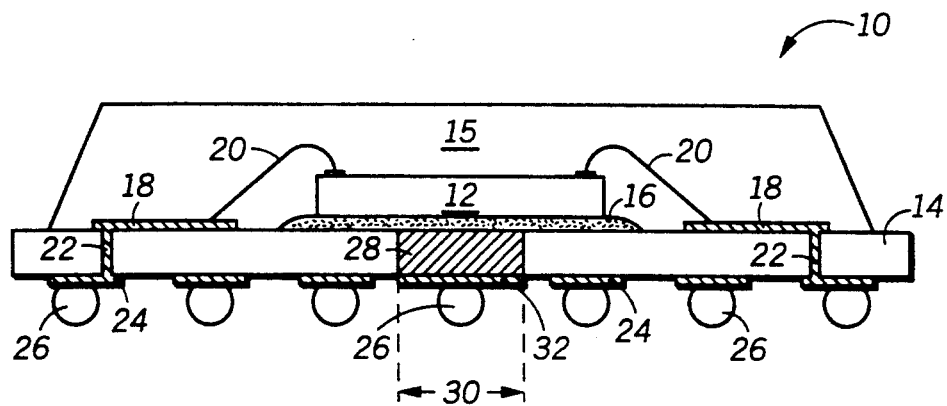
FIG. 1 is a cross-sectional view of a semiconductor device in accordance with the present invention.

FIG. 1 illustrates, in a cross-sectional view, a semiconductor device 10 in accordance with the present invention. Device 10 includes a semiconductor die 12 mounted to circuitized substrate 14 within a die receiving area of a top surface of the substrate. The die and portions of the substrate are encapsulated in a conventional epoxy resin package body 15, although other types of package bodies may also be used in accordance with the present invention. A conventional die attach material 16, such as silver-filled epoxy, is used to mount die 12 to substrate 14. In most instances die 12 will be a integrated circuit (IC), such as a microprocessor or memory, which generates a significant amount of heat during operation. However, the present invention is beneficial to all types of devices since nearly all ICs generate some degree of heat.

Substrate 14 is called a circuitized substrate because it is used for routing electrical signals to and from semiconductor die 12. To accomplish signal routing, substrate 14 includes a plurality of conductive traces 18 on its top surface. In most instances, conductive traces will also be on a bottom surface the substrate, as represented clearly in FIG. 4. However, the particular cross-sectional view of FIG. 1 does not illustrate bottom-side traces. Semiconductor die 12 is electrically coupled to conductive traces 18 by conventional wire bonds 20, or by other known coupling methods such as tape-automated-bonding (TAB), flip-chip bonding, direct-chip-attach, or the like. Also to enable signal routing, circuitized substrate 14 includes a plurality of conductive vias 22. Conductive vias 22 extend through substrate 14 and electrically couple conductive traces on the top surface of the substrate to those on the bottom. Typically, one conductive via is used to couple one trace on the top of the substrate with one trace on the bottom. At an end portion of each conductive trace on the bottom of circuitized substrate is an integral conductive pad 24 for receiving a solder ball 26. Solder balls 26 are terminals of device 10 which permit external electrical accessibility to semiconductor die 12. Typically, pads 24 and solder balls 26 will be arranged in an array configuration on the bottom of substrate 14, thus device 10 is referred to as a pad array or ball array device. Rather than using solder balls, conductive pins (not illustrated) may be coupled to pads 24 to establish a pin grid array device also in accordance with the present invention.

Substrate 14 is manufactured using conventional processes. The bulk material used for the substrate is preferably a resin, such as an epoxy, polyimide, triazine, or phenolic resin. More specifically, a bismaleimidetraizine (BT) resin is preferred; however other substrate material are also suitable. For instance, various epoxy-glass composites, printed circuit board (PCB) materials, flexible circuits, or ceramic substrates may be used. Conductive traces 18 and pads 24 are typically formed on substrate 14 by laminating a conductive foil, usually copper, to the substrate. Traces and pads are defined by patterning the foil using lithography techniques. Alternatively, traces and pads may be screen printed or otherwise deposited onto surfaces of the substrate. Both the conductive traces and pads are typically plated with gold to establish a non-oxidizable surface for bonding wire bonds 20 and attaching solder balls 26. Thus, the traces and pads will typically include two layers, a laminated layer of copper and an overlying plated layer of gold or a combination of nickel and gold. However, for purposes of clarity the conductive traces, pads and vias are illustrated as being of a single layer of material throughout the description of the present invention. Conductive vias 22 are typically formed in substrate 14 by drilling or punching holes through the substrate and subsequently plating the holes with copper, and sometime also with nickel and gold, so that only sidewalls of the holes are conductive. Inner portions of the holes are usually hollow. Solder balls 26 are coupled to pads 24 by physically positioning each ball on a pad in the presence of a flux and performing a solder reflow operation to form a metallurgical bond.

In accordance with the present invention, circuitized substrate 14 also includes a thermal conductor 28 positioned within an opening 30 in the substrate. In device 10 illustrated in FIG. 1, opening 30 extends from the top surface of the substrate to the bottom surface and thermal conductor 28 is planar with both the top and bottom substrate surfaces. While exact planarity between thermal conductor and the top and bottom surfaces of the substrate may not be achievable, depending on the method by which thermal conductor 28 is formed or inserted, it is desirable to have sufficient planarity to permit reliable and manufacturable attachment of semiconductor die 12 over the thermal conductor. Opening 30 is preferably formed in substrate 14 using conventional drilling or punching operations, although other methods may be used in accordance with the invention. If drilled, opening 30, and therefore thermal conductor 28, is most likely circular due to the shape of conventional drill bits. Thicknesses of conventional BT resin substrates used in pad array devices are on the order of 10 to 20 mils (0.25 to 0.51 mm); therefore, thermal conductor 28 also has a thickness in this range in a preferred embodiment of the present invention. In order to remove a sufficient amount of heat from semiconductor die 12, the width or length of thermal conductor 28 should be larger than its thickness. As one suitable example, a disk shaped thermal conductor used in accordance with the present invention has a thickness of 20 mils (0.5 mm) or less and a diameter of 80 mils (2.0 mm) or more. As will be addressed below, however, the area of thermal conductor 28 should be smaller than the area of semiconductor die 12.

Like conductive traces 18 and conductive pads 24, thermal conductor 28 may be plated. For instance as illustrated in FIG. 1, the portion of the thermal conductor exposed on the bottom surface of substrate 14 is covered by a plated area 32. Conveniently, a plated area can be formed at the same time conductive traces 18 and conductive pads 24 are plated. In a preferred embodiment of the present invention, thermal conductor 28 is made of copper or a copper alloy; therefore, a plated area of gold or nickel and gold can be used to establish a more solderable surface for attaching one or more solder balls 26 to the thermal conductor. There are advantages in attaching solder balls or other terminals to the thermal conductor, or more preferably to a metallized area covering the thermal conductor. One advantage is that solder balls will extend the heat removal path beyond the thermal conductor to a user substrate. An extended thermal path is particularly useful if device 10 is mounted to a user substrate equipped with a cooling mechanism. Another advantage in coupling a solder ball or other terminal to the thermal conductor is the ability to utilize the thermal conductor as a ground plane as described below in reference to FIGS. 2-4.

Figure 2:
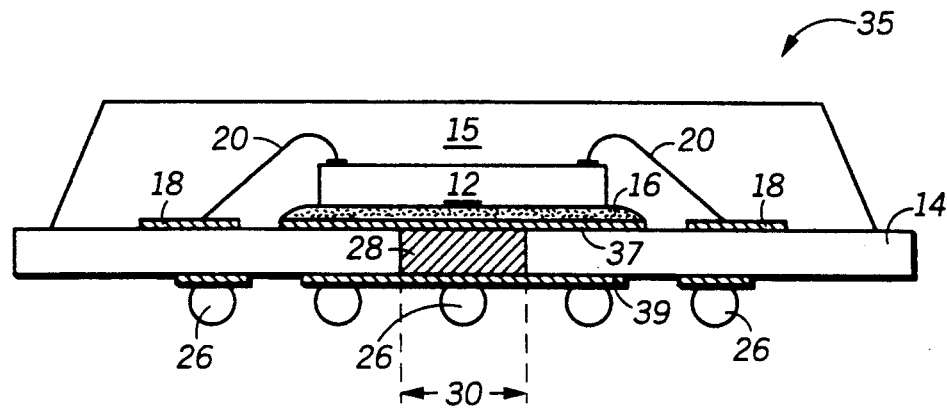
FIG. 2 is a cross-sectional view of another semiconductor device in accordance with the present invention, taken along the line 2—2 of FIGS. 3 and 4.
Figure 3:
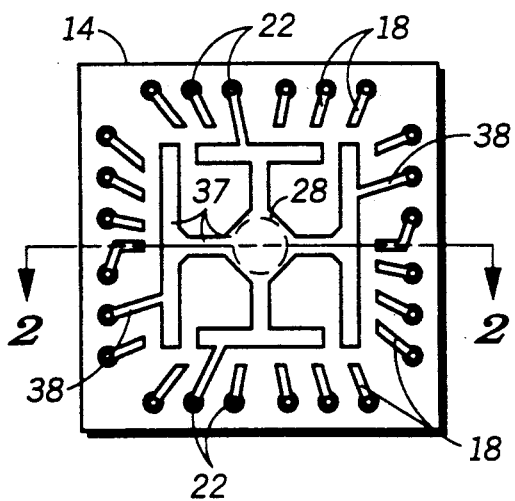
FIG. 3 is a plan view of a top surface of a circuitized substrate used in the semiconductor device of FIG. 2.
Figure 4:
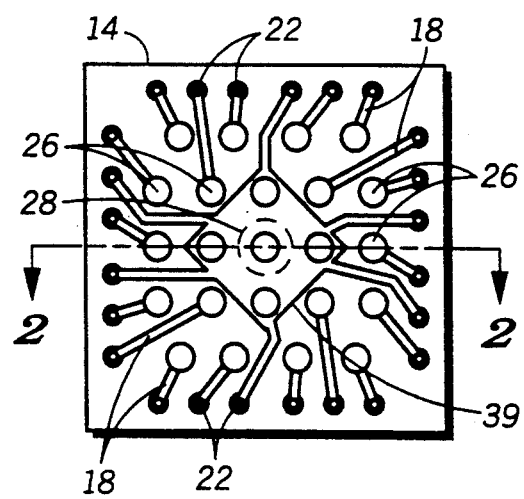
FIG. 4 is a plan view of a bottom surface of a circuitized substrate used in the semiconductor device of FIG. 2.

FIG. 2 is a cross-sectional view of a semiconductor device 35 in accordance with the present invention in which a thermal conductor is used as part of a ground plane. FIG. 3 is a top view of the circuitized substrate 14 of FIG. 2 and FIG. 4 is a bottom view of the same substrate. The lines 2—2 of FIG. 3 and FIG. 4 represent the portion of substrate 14 through which the cross-sectional view of FIG. 2 is taken. Throughout the various figures and remaining portions of the description of the invention, like reference numerals designate identical or corresponding parts to those already introduced. Device 35 of FIG. 2 includes semiconductor die 12 mounted over a plated, metallized area 37 formed on the top surface of substrate 14. Metallized area 37, like traces 18, will usually include two layers, a laminated conductive layer with an overlying plated conductive layer. Rather than showing two layers, however, only one layer is illustrated for the sake of clarity. While a laminated layer is most conveniently defined at the same traces 18 are defined (typically before forming opening 30), a plated layer is deposited after thermal conductor 28 is inserted into opening 30 so that at least a portion of the plated, metallized area covers and is thermally and electrically coupled to thermal conductor 28. A plated region which covers both the thermal conductor and portions of the substrate also secures, to a small degree, thermal conductor 28 within opening 30. Device 35 also includes a plated, metallized area 39 which is equivalent to metallized area 37, but is formed on bottom surface of substrate 14.

The purpose of metallized areas 37 and 39 in device 35 is two-fold. First, both areas provide additional area for thermal conduction. Metallized area 37, in conjunction with thermal conductor 28, is able to conduct more heat away from die 12 than the thermal conductor alone. Likewise, metallized area 39, in conjunction with thermal conductor 28, is able to distribute more heat than the thermal conductor alone. Second, metallized areas 37 and 39 can be used as ground planes of device 35. By integrating designated ground traces 38 with metallized areas 37 and 39, as illustrated in FIGS. 3 and 4, electrical performance of device 35 is improved since trace inductance and signal noise is reduced in comparison to devices not having ground planes. For additional thermal and electrical performance improvements, conductive vias (not illustrated) may be formed in substrate 14 to couple metallized areas 37 and 38 together. It is important to note that in order to achieve the desirable thermal and electrical characteristics described in reference to device 35, it is not necessary to use the exact metallized area configurations illustrated in FIGS. 3 and 4. Although ideally, at least from a device performance point of view, both metallized areas should be made as large as possible, other considerations will govern the size and layout of the metallized areas. For instance, the metallized area on the top of substrate may be configured to improve the manufacturability and reliability of the die bonding process, the metallized areas should not unduly restrict the routing of conductive traces and position of solder balls, and overall device size should be kept small. It is also important to point out that, if used at all, one need not use two metallized areas. Device performance can be enhanced using a metallized area on either the top or bottom surface of the substrate alone.

As FIG. 2 and FIG. 4 also illustrate, solder balls 26 are coupled to metallized area 39. These solder balls help fulfill the two-fold purpose of the metallized areas. Namely, the solder balls aid in thermal dissipation of the device by extending the thermal conduction path beyond thermal conductor 28 and metallized area 39 to a user substrate (not illustrated). Also, solder balls attached to metallized area 39 may be used as ground terminals of device 35 to keep metallized areas 37 and 39 and thermal conductor 28 at ground potential.

Figure 5:
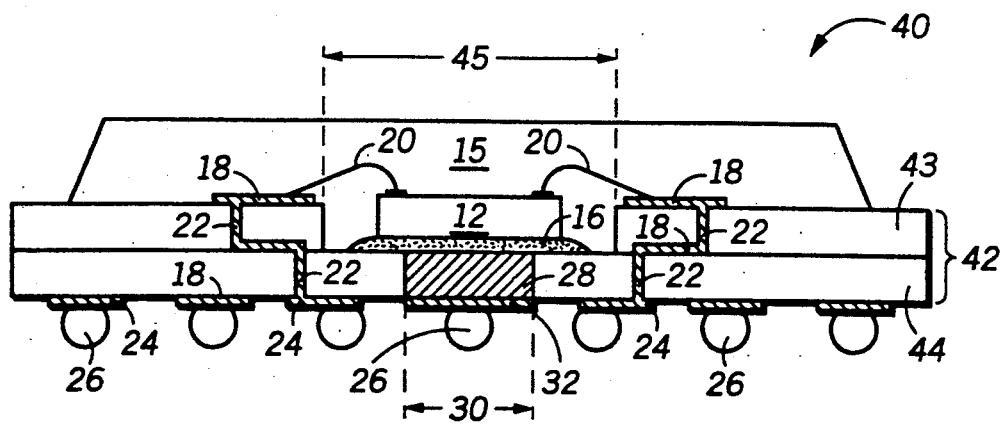
FIG. 5 is a cross-sectional view of a semiconductor device also in accordance with the present invention which employs a multilayer circuitized substrate.

FIG. 5 illustrates, in a cross-sectional view, another form of the present invention. A semiconductor device 40 utilizes a multilayer circuitized substrate 42. In addition to having conductive traces on both top and bottom surfaces, substrate 42 also includes internal conductive layers. Multilayer substrates are typically used in semiconductor devices having a large terminal count since the multiple conductive layers permit a high degree of circuit density in the substrate. Fabrication of multilayer substrates is well understood in the industry, therefore details of fabrication will not be addressed. In general, multilayer substrates are formed by laminating two or more single layer substrates together. Upon lamination, a multilayer substrate will include conductive traces and vias at various levels in the substrate. Multilayer substrate 42 includes two single layer substrates 43 and 44 laminated together and has conductive traces 18 and conductive vias 22 at more than one level.

In using a multilayer substrate in accordance with the present invention, an opening 45 is formed in the top surface of multilayer substrate 42 as illustrated in FIG. 5. Opening 45 does not extend completely through substrate 42, but instead forms a die receiving cavity in the substrate in which semiconductor die 12 is mounted. Opening 45 may be formed in single layer substrate 43 before lamination to form multilayer substrate 42. Or, opening 45 may be formed after substrates 43 and 44 are laminated together using, for example, a milling or routing operation. Similarly, opening 30 which contains thermal conductor 28 may be formed either before or after substrates 43 and 44 are laminated together. A purpose in providing opening 45 rather than simply extending opening 30 through both single layer substrates 43 and 44 is to reduce the height or profile of device 40. Without opening 45, semiconductor die 12 would be mounted to the top surface of multilayer substrate 42 and a package body would have to be taller than package body 15 in order to adequately encapsulate the die and wire bonds. However, it is important to note that if using a multilayer substrate with the present invention, opening 45 is not required, only desirable for achieving a low-profile device. As stated earlier, rather than forming opening 45, opening 30 could extend through both single layer substrate 43 and 44 to be in thermal contact with semiconductor die 12. Another important note is that multilayer substrate 42 is not limited to including two single layer substrates as illustrated in FIG. 5. Any number of layers in a circuitized substrate may be used with the present invention.

In accordance with the present invention, and as demonstrated in each of FIGS. 1-5, opening 30 which contains thermal conductor 28 is smaller in area than semiconductor die 12. More specifically, it is recommended that the area of thermal conductor 28 be approximately 10-75% of the area of die 12. On one hand, this relationship goes against standard industry practice to utilize thermal conductors and heat sinks which have as large a conductive area as possible. However, this same relationship has many advantages. First, conductive traces and terminals can be routed under semiconductor die 12 even with thermal conductor 28 in place. The ability to route and position terminals underneath the die establishes a compact device size with high terminal density. In addition, terminals can be directly attached to the thermal conductor. Second, the small area and thickness of thermal conductor 28 does not significantly increase the weight of a device, unlike many traditional heat sinks. Excessive weight is a disadvantage for semiconductor devices, especially with respect to most consumer product applications. And third, even though thermal conductor 28 has a smaller area than semiconductor die 12, heat transfer through thermal conductor 28 is significantly higher than existing heat removal methods used in pad array devices. As an example, a copper disk having a 2 mm diameter has a cross-sectional area of 3.14 $mm^2$. Conventional thermal vias used in pad array devices each have a cross-sectional area on the order of 0.02 $mm^2$ (assuming the via has a diameter of 0.3 mm and a plating thickness of 0.02 mm). Therefore, the conductive area of thermal conductor 28 is equivalent to more than one hundred and fifty conductive vias, yet occupies less than one-third the area in a substrate.

Figure 6:
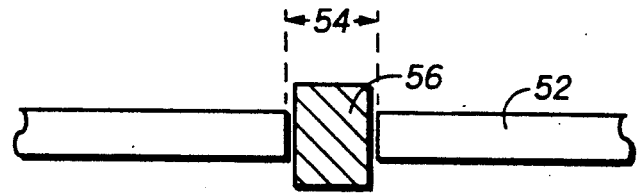
FIGS. 6-8 are cross-sectional views of a portion of a circuitized substrate illustrating a process used to form a semiconductor device in accordance with the present invention.
Figure 7:
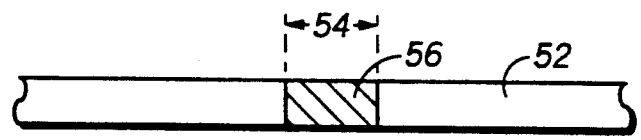
Figure 8:
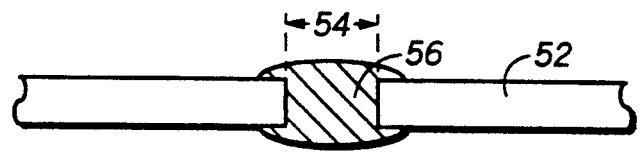

Realizing the benefits of using a thermal conductor in a semiconductor device of the present invention, it is useful to understand methods in which such a thermal conductor can be incorporated into a circuitized substrate. FIGS. 6-8 illustrate in cross-section one method in accordance with the invention. FIG. 6 illustrates a portion of a circuitized substrate 52 having an opening 54 formed therein. Other elements of substrate 52, such as conductive traces, conductive pads, and vias, are not illustrated in FIGS. 6-8. It is important to note, however, that these elements may be formed before, during, or after the formation of opening 54. As mentioned previously, opening 54 is preferably drilled or punched through substrate 52. Positioned within opening 54 is a metal plug 56. The width of metal plug 56 is slightly smaller than that of opening 54 in order to facilitate positioning the plug in the opening. Other dimensions of plug 56 are addressed below. After positioning plug 56 in opening 54, the plug is plastically deformed so that the plug completely fills opening 54 as illustrated in FIG. 7. A preferred method of deforming the plug is by compressing the top and/or bottom of the plug with a flat plate (not illustrated) to make the thermal conductor planar with the substrate. Using this method, the planarity of plug 56 with respect to substrate 52 will be dependent upon the volume of plug 56 in comparison to the volume of opening 54. Ideally, the two volumes are equal to establish almost perfect planarity between the plug and the substrate, as illustrated in FIG. 7. If the volume of plug 56 is larger than that of opening 54, upon compression the plug will extend beyond the opening, as illustrated in FIG. 8. Depending upon the severity of non-planarity, it may be necessary perform subsequent processing, such as etching or polishing, to flatten the exposed surfaces of thermal conductor plug 56. For instance, if a non-planar surface obstructs attachment of a semiconductor die to the top of substrate 52 or attachment of terminals to the bottom of substrate 54, a more planar surface may be needed. However, a perfectly planar surface is not required.

Figure 9:
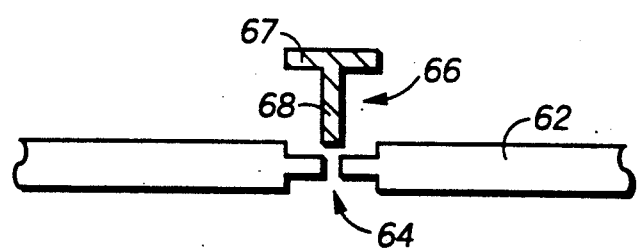
FIGS. 9-10 are cross-sectional views of a portion of a circuitized substrate illustrating a process used to form a semiconductor device also in accordance with the present invention.
Figure 10:
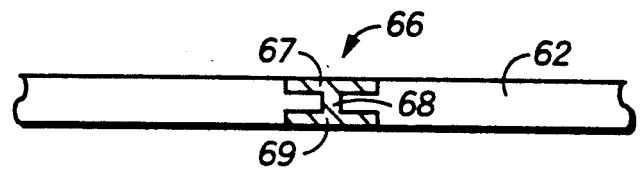

Another method of fabricating a thermal conductor in a semiconductor device in accordance with the present invention is illustrated in FIGS. 9-10. This method is in many ways similar to a riveting process. FIG. 9 is a cross-sectional view of a portion of a circuitized substrate 62. Again, not all of the conductive elements of the substrate are illustrated for the sake of clarity in FIGS. 9-10. Included in substrate 62 is an opening 64. Unlike previously described openings, opening 64 is contoured in an I-shape. The shape of opening 64 requires more complex manufacturing than a single punching or drilling operation used to form an opening with completely vertical sidewalls. One method in which opening 64 can be formed in substrate 62 is through a combination of drilling and routing techniques. A small hole can be drilled or punched completely through substrate 62, after which the top and bottom surfaces of the substrate are routed or milled to form the larger portions of opening 64. Upon forming opening 64, using any available method, a conductive plug 66 is inserted into the opening as illustrated in FIG. 9. Plug 66 has a first head portion 67 and a stem portion 68. Stem portion 68 fits into the smaller, central portion of opening 64, while head portion 67 rests on the protruding portions of substrate 62 which lie inside opening 64. After positioning plug 66 in opening 64, the portion of stem 68 which extends below substrate 62 is compressed to completely fill opening 64, as illustrated in FIG. 10. Compressing or otherwise deforming stem 68 to fill opening 64 creates a second head 69 on plug 66, thereby making plug 66 conform to the I-shape of opening 64.

Figure 11:
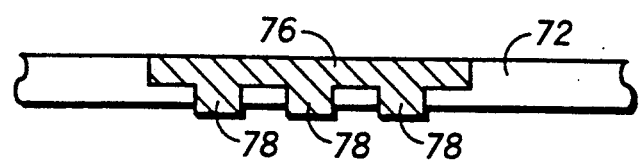
FIG. 11 is a cross-sectional view of a portion of a circuitized substrate illustrating another configuration of a thermal conductor suitable for use with the present invention.

A slight variation to the method illustrated in FIGS. 9-10 involves using a conductive plug having more than one stem portion. Illustrated in a cross-sectional view in FIG. 11 is a portion of a circuitized substrate 72 having a conductive plug 76 which conforms to multiple openings formed in the substrate. Conductive plug 76 may be incorporated into substrate 72 using the above described compression techniques or simply by bonding the thermal conductor into substrate 72 with an adhesive material. Conductive plug 76 has three post portions 78 which are exposed on the bottom of substrate. An advantage in using the conductive plug shape illustrated in FIG. 11 is that more substrate surface area is available on the bottom surface of substrate 72 than if the bottom of conductive plug 76 had the same surface area as the top. Furthermore, if substrate 72 is a multilayer substrate, conductive traces could lie between post portions 78 for an even higher trace density.

Figure 12:
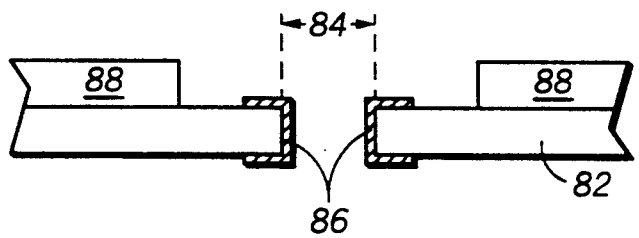
FIGS. 12-15 are cross-sectional views of a portion of a circuitized substrate illustrating yet another process used to form a semiconductor device in accordance with the present invention.

Yet another method of forming a thermal conductor in a semiconductor device in accordance with the present invention is illustrated in FIGS. 12-15. In this method, the thermal conductor is formed using plating techniques. FIG. 12 illustrates a cross-sectional view of a portion of a circuitized substrate 82 having an opening 84. Present on the sidewalls of opening 84 and surrounding the opening on both top and bottom surfaces of substrate 82 are plated portions 86. Plated portions 86 may be formed around the opening during conventional circuitized substrate plating processes. For example, plated portions 86 may be formed during plating of conventional conductive vias (not illustrated). Therefore, at least initially, plated portions 86 will have a standard plating thickness of on the order of 0.01-0.03 mm. To transform the plated portions 86 illustrated in FIG. 12 into a thermal conductor suitable for use in a semiconductor device in accordance with the present invention, additional plating beyond typical plating thicknesses is required. However, additional plating in areas beyond plated portions 86 should be avoided. To accomplish this, a masking layer 88 is formed on substrate 82 such that only portions of the substrate near opening 86 will be additionally plated.

Figure 13:
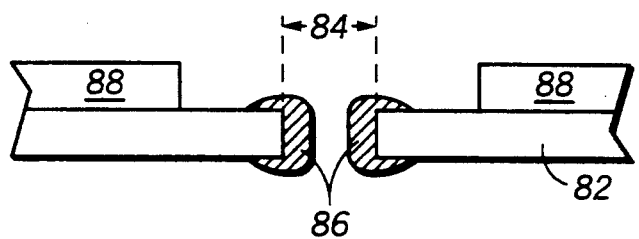
Figure 14:
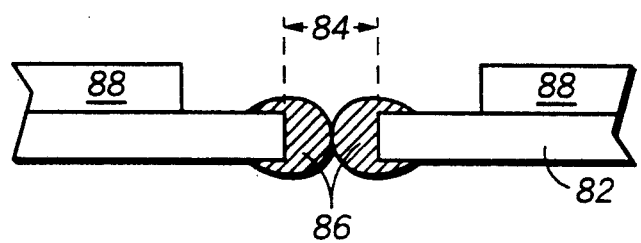
Figure 15:
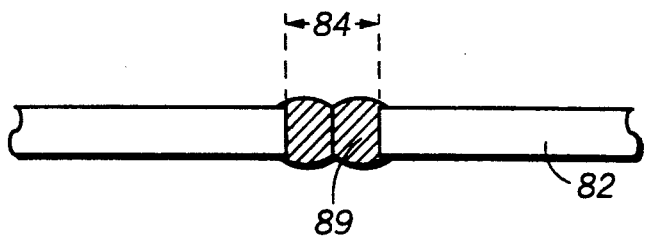

FIGS. 13 and 14 illustrate how the thickness of plated portion 86 will change as plating time increases. Eventually, the plated portions at opposite sides of opening 84 will converge. It is expected that plating alone will probably not produce an adequate thermal conductor, but that an additional operation will be necessary. For instance in FIG. 14, even though plated portions 86 have converged, the plating does not establish a planar surface with substrate 82 nor is opening 84 completely filled. One method for solving these problems is to perform a subsequent compression or polishing operation to deform the plating material entirely within opening 84, as illustrated in FIG. 15 to form a thermally conductive plug 89.

The foregoing description and illustrations contained herein demonstrate many of the advantages associated with the present invention. In particular, it has been revealed that a pad array semiconductor device using a thermal conductor in accordance with the present invention significantly improves the thermal conduction area in comparison to using conventional thermal vias. Moreover, use of a thermal conductor in a pad array device permits routing of conductive traces and terminals beneath a semiconductor die for improved utilization of circuitized substrate area. Yet another advantage is that the improvement in thermal performance of a device in accordance with the present invention does not significantly increase device weight or overall size. Furthermore, a thermal conductor in a device of the present invention can enhance electrical performance by utilizing the conductor, either alone or in conjunction with one or more metallized areas on a circuitized substrate, as a ground plane.

Thus it is apparent that there has been provided, in accordance with the invention, a pad array semiconductor device having a thermal conductor, and a process for making the same, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, a thermal conductor need not be incorporated into a circuitized substrate using only those methods disclosed herein. It is envisioned that other methods can be used to secure the thermal conductor in an opening in the substrate. For instance, a threaded thermal conductor can be screwed into an opening in the substrate. (The substrate material may be malleable enough that an opening in the substrate for receiving a screw-like conductor need not be threaded). In addition, the invention is not limited to the specific shapes or dimensions of thermal conductors described and illustrated herein. Nor is the present invention limited to the specific conductive trace, conductive via, or solder ball arrangements illustrated. In addition, it is not necessary that a thermal conductor used in accordance with the present invention have an overlying or adjacent metallized or plated area. Furthermore, it is conceived that rather than using one thermal conductor as illustrated herein that a plurality of smaller thermal conductors may be desirable in certain applications. Therefore, it is intended that this invention encompass all such variations and modifications as fall within the scope of the appended claims.

We claim:

1. A semiconductor device comprising:
    a circuitized substrate having a top surface, a bottom surface, a plurality of conductive traces formed on the top surface, a plurality of conductive vias extending through the substrate and electrically coupled to the plurality of conductive traces, and a die receiving area;
    an opening in the substrate which extends from the die receiving area to the bottom surface, the opening being smaller in area than the die receiving area and larger in area than each of the conductive vias;

a thermal conductor fixedly positioned in and filling the opening in the substrate which is substantially planar with the die receiving area and with the bottom surface of the substrate;

a metallized area covering the thermal conductor on the bottom surface of the substrate;

a semiconductor die mounted to the substrate within the die receiving area, overlying the opening and the thermal conductor, and electrically coupled to the plurality of conductive traces;

a plurality of terminals physically coupled to the bottom surface of the substrate and electrically coupled to the plurality of conductive vias; and at least one terminal physically coupled to the metallized area and thermally coupled to the thermal conductor.

2. The semiconductor device of claim 1 wherein the at least one terminal thermally coupled to the thermal conductor comprises at least one terminal physically coupled to, and directly beneath, the thermal conductor.

3. The semiconductor device of claim 2 wherein the plurality of terminals and the at least one terminal each comprise solder ball terminals.

4. The semiconductor device of claim 1 wherein the thermal conductor is a disk comprised of copper.

5. The semiconductor device of claim 4 wherein the disk has a thickness not greater than 0.5 mm.

6. The semiconductor device of claim 1 wherein the metallized area extends beyond the thermal conductor onto the bottom surface of the substrate.

7. The semiconductor device of claim 6 wherein the at least one terminal thermally coupled to the thermal conductor comprises at least one terminal attached to the metallized area on the bottom surface of the substrate and displaced from the thermal conductor.

8. The semiconductor device of claim 1 wherein the substrate has a plurality of openings which extend from the die receiving area to the bottom surface of the substrate and wherein the thermal conductor fills each opening.

9. The semiconductor device of claim 1 further comprising a recess in the top surface of the substrate which does not extend completely through to the bottom surface of the substrate, the recess having a bottom surface which defines the die receiving area.

10. A semiconductor device comprising:

a circuitized substrate having a top surface, a bottom surface and a die receiving area;

a first plurality of conductive traces formed on the top surface of the substrate;

a second plurality of conductive traces formed on the bottom surface of the substrate;

a plurality of conductive vias which extend through the substrate and electrically couple the first and second pluralities of conductive traces;

an opening centrally located in the substrate within the die receiving area and extending from the top surface to the bottom surface, the opening being larger in area than each of the conductive vias;

a metal disk having a top surface, a bottom surface, and a first area, the disk being fixedly positioned in the opening such that the top and bottom surfaces of the disk are approximately planar with the top and bottom surfaces of the substrate, respectively;

a metallized area covering the bottom surface of the metal disk;

a semiconductor die having a second area larger than the first area and mounted to the substrate within the die receiving area and above the metal disk such that the die and metal disk are in thermal contact;

means for electrically coupling the semiconductor die to the first plurality of conductive traces;

a plurality of solder balls physically coupled to the bottom surface of the substrate and electrically coupled to the second plurality of conductive traces; and at least one solder ball physically coupled to the metallized area and thermally coupled to the metal disk.

11. The semiconductor device of claim 10 wherein the at least one solder ball is physically coupled to the metallized area and is directly beneath the metal disk.

12. The semiconductor device of claim 10 wherein the metallized area extends beyond the metal disk onto the bottom surface of the substrate and wherein the at least one solder ball is attached to the metallized area and displaced from the metal disk.

13. The semiconductor device of claim 10 further comprising a metallized area on the top surface of the substrate which covers the top surface of the metal disk.

14. The semiconductor device of claim 13 wherein the metallized area on the top surface of the substrate and the metal disk are electrically coupled to at least one of the conductive traces of the first plurality of conductive traces, and wherein the at least one conductive trace is designated as a ground potential trace.

15. The semiconductor device of claim 10 wherein the metal disk has a thickness not greater than 0.5 mm.

16. The semiconductor device of claim 10 wherein the circuitized substrate is a resin-based circuitized substrate comprised of a resin selected from a group consisting of epoxy, polyimide, triazine, and phenolic resins.

17. A process for making a semiconductor device, comprising the steps of:

providing a circuitized substrate having a top surface, a bottom surface, a plurality of conductive traces formed on the top surface, a plurality of conductive vias extending through the substrate and electrically coupled to the plurality of conductive traces, a die receiving area, an opening which extends from the die receiving area to the bottom surface and is smaller in area than the die receiving area and larger in area than each of the vias, a thermal conductor filling and fixedly positioned in the opening of the substrate such that the thermal conductor is substantially planar with the die receiving area and the bottom surface of the substrate, and a metallized area covering the thermal conductor on the bottom surface of the substrate;

providing a semiconductor die;

mounting the semiconductor die to the substrate within the die receiving area and overlying the thermal conductor;

electrically coupling the semiconductor die to the plurality of conductive traces;

physically coupling a plurality of signal terminals to the bottom surface of the substrate such that the signal terminals are electrically coupled to the plurality of vias; and physically coupling at least one terminal to the metallized area such that the at least one terminal is thermally coupled to the thermal conductor.

18. The process of claim 17 wherein the steps of physically coupling a plurality of signal terminals and physically coupling at least one terminal comprise physically coupling a plurality of solder balls and physically coupling at least one solder ball, respectively.

19. The process of claim 18 wherein the step of physically coupling at least one solder ball to the metallized area comprises physically coupling the at least one solder ball to the metallized area such that the at least one solder ball is displaced from the metal disk.

20. The process of claim 18 wherein the step of physically coupling at least one solder ball comprises physically coupling at least one solder ball to, and directly beneath, the thermal conductor.

21. A process of making a circuitized substrate comprising the steps of:
providing a resin-based substrate having a top surface, a bottom surface, and a die receiving area;
forming a first plurality of conductive traces on the top surface of the substrate;
forming a second plurality of conductive traces on the bottom surface of the substrate;
forming a plurality of conductive vias which extend through the substrate and electrically coupling the first and second pluralities of conductive traces;
forming an opening in the die receiving area of the substrate which extends through the substrate and which is larger in area than each of the conductive vias;
providing a thermal conductor having dimensions to allow at least a portion of the thermal conductor to fit through the opening;
positioning the thermal conductor in the opening; and
compressing the thermal conductor to deform the thermal conductor into a shape which fills the opening and is substantially planar with both the top and bottom surfaces of the substrate, such that the thermal conductor is affixed within the opening by a compression fit.

22. The process of claim 21 wherein the step of compressing the thermal conductor comprises compressing the thermal conductor to deform the thermal conductor into a disk shape.

23. The process of claim 21 wherein the step of providing a thermal conductor comprises providing a thermal conductor comprised of copper.

24. The process of claim 21 wherein the step of providing a thermal conductor comprises providing a thermal conductor having a stem portion and a first head portion, wherein the step of positioning the thermal conductor comprises positioning the stem portion of the thermal conductor in the opening, and wherein the step of compressing the thermal conductor comprises compressing the stem portion of the thermal conductor to form a second head portion, wherein the first and second head portions are both substantially planar with one of the top and bottom surfaces of the substrate.

25. The process of claim 21 wherein the step of forming an opening comprises drilling through the substrate.

26. The process of claim 21 further comprising the step of forming a metallized area on the bottom surface of the substrate which covers the thermal conductor.

27. The process of claim 26 further comprising the step of plating the metallized area and a portion of the thermal conductor exposed on the bottom surface of the substrate in order to establish an electrical connection between the thermal conductor and the metallized area.

28. A process of making a semiconductor device comprising the steps of:
providing a circuitized substrate made according to a method comprising the steps of:
providing a resin-based circuitized substrate having a top surface, a bottom surface, and a die receiving area;
forming an opening in the die receiving area of the substrate which extends through the substrate;
providing a thermal conductor having dimensions to allow at least a portion of the thermal conductor to fit through the opening;
positioning the thermal conductor in the opening; and
compressing the thermal conductor to deform the thermal conductor into a shape which fills the opening and affixes the thermal conductor within the opening, whereupon deforming the thermal conductor becomes substantially planar with the top and bottom surfaces of the substrate;
providing a semiconductor die;
mounting the semiconductor die to the substrate within the die receiving area of the substrate and overlying the compressed thermal conductor;
electrically coupling the semiconductor die to the circuitized substrate;
encapsulating the semiconductor die and portions of the top surface of the substrate; and
physically coupling a plurality of terminals to the bottom surface of the substrate, wherein a first portion of the plurality of terminals is electrically coupled to the semiconductor die and wherein at least one terminal of the plurality of terminals is electrically and thermally coupled to the thermal conductor.

29. The process of claim 27 wherein the step of physically coupling a plurality of terminals comprises attaching a plurality of solder balls.

30. The device of claim 3 wherein the thermal conductor is larger in area than the at least one solder ball thermally coupled thereto.

31. The device of claim 10 wherein the metal disk is larger in area than the at least one solder ball thermally coupled thereto.

32. The process of claim 18 wherein the step of physically coupling at least one solder ball comprises physically coupling at least one solder ball to the thermal conductor, wherein the at least one solder ball is smaller in area than the thermal conductor.

* * * * *